United States Patent [19]
Lowrey et al.

[11] Patent Number: 5,252,504
[45] Date of Patent: Oct. 12, 1993

[54] REVERSE POLYSILICON CMOS FABRICATION

[75] Inventors: Tyler A. Lowrey; Fernando Gonzalez; Ruojia Lee, all of Boise, Id.

[73] Assignee: Micron Technology, Inc., Boise, Id.

[21] Appl. No.: 835,003

[22] Filed: Feb. 11, 1992

Related U.S. Application Data

[63] Continuation of Ser. No. 485,007, Feb. 26, 1990, abandoned, which is a continuation-in-part of Ser. No. 189,411, May 2, 1988, Pat. No. 4,957,878, and a continuation-in-part of Ser. No. 189,414, May 2, 1988.

[51] Int. Cl.$^5$ .................. H01L 21/336; H01L 27/108
[52] U.S. Cl. ........................... 437/34; 437/47; 437/48; 437/52; 437/56; 437/57; 437/60; 257/379
[58] Field of Search .................. 437/40, 41, 44, 47, 437/48, 52, 56, 57, 60, 27, 28, 29, 30, 34, 919, 233; 257/371, 379

[56] References Cited

U.S. PATENT DOCUMENTS

| | | | |
|---|---|---|---|
| 4,561,170 | 12/1985 | Doering et al. | 437/48 |
| 4,871,688 | 10/1989 | Lowrey | 437/48 |
| 4,945,066 | 7/1990 | Kang et al. | 437/47 |
| 4,957,878 | 9/1990 | Lowrey et al. | 437/47 |
| 5,026,657 | 6/1991 | Lee et al. | 437/44 |

FOREIGN PATENT DOCUMENTS

| | | |
|---|---|---|
| 0017164 | 1/1982 | Japan . |
| 0213051 | 10/1985 | Japan . |
| 0165355 | 7/1987 | Japan . |
| 2150349 | 6/1985 | United Kingdom . |

*Primary Examiner*—Mary Wilczewski
*Attorney, Agent, or Firm*—Stanley N. Protigal

[57] ABSTRACT

A CMOS integrated circuit such as a DRAM is fabricated, in which a first layer of polysilicon is used to form transistor gates, and capacitor cell plates are formed from a second polysilicon layer.

N-wells are first formed, followed by initial oxide. The application of the CMOS process to the reverse poly technique provides enhanced alignment of critical transistor gates and permits the use of less mask steps in fabricating the CMOS circuit.

20 Claims, 16 Drawing Sheets

REVERSE POLYSILICON CMOS FABRICATION

CROSS REFERENCE TO RELATED APPLICATIONS

This application continuation-in-part of U.S. Patent Application Ser. No. 189,411, filed May 2, 1988, now U.S. Pat. No. 4,957,878, and Ser. No. 189,414, filed May 5, 1989.

FIELD OF THE INVENTION

This invention relates to VLSI semiconductor CMOS processes, and more specifically to blanket-channel stop implants of dopant into p well and n well regions. The invention is particularly applicable to dynamic random access memory devices (DRAMS).

The invention is used in a complete fabrication process for a cost-effective manufacturable means of high volume production of CMOS high density integrated circuits. It is called the reverse poly process.

BACKGROUND OF THE INVENTION

The invention uses various materials which are electrically either conductive, insulating or semiconducting, although the completed semiconductor circuit device itself is usually referred to as a "semiconductor." One of the materials used is silicon, which is used as either single crystal silicon or as polycrystalline silicon material, referred to as polysilicon or "poly" in this disclosure.

While the invention is described in terms of DRAMs, this is merely the preferred embodiment for which the inventive techniques were developed. DRAM process techniques are also applicable to related semiconductor circuit devices, including video random access memories (VRAMs) and other multiport RAMS, and other devices which use DRAM design techniques, such as optical sensing arrays. Significantly, DRAM process techniques are usually applicable to other types of semiconductor devices as well. In this respect, DRAM technology is considered to be a "driving technology" for other integrated circuit technology, and therefore the inventive techniques are expected to be applicable for other types of integrated circuits.

Producing DRAM IC memory circuits is a high volume business, in which process efficiency and manufacturability as well as product quality, reliability, and performance are essential key factors. This invention dramatically advances the "state of the art" in a number of ways in these areas.

The reverse poly DRAM process dramatically reduces the number of process steps, including masking steps, which has a direct impact on the cost, reliability, and manufacturability of the product. Latest generation DRAM products require scaling down to finer and finer geometries. This has a big impact on the cost of doing a photolithographic step. The source of this added cost comes from many sources. There are high capital costs associated with "state of the art" photolithographic equipment. Finer geometries require more complex photo processing in terms of more photo process steps per level and more equipment required, adding cost and using expensive ultra clean room floor space. Defect density is inevitably increased with each additional photomasking layer and compromises line yield, probe yield, and reliability. All photo layers require a subsequent step, either implant or etch. These are added steps adding to cost.

In a reverse poly DRAM process, it is possible to avoid extra mask steps for $V_T$ adjust. In DRAM applications the threshold voltage of the array access transistors may have separate requirements from the peripheral transistors. The access devices generally need a higher threshold than the periphery to optimize dynamic refresh characteristics. Peripheral transistors are optimized at reduced threshold values for maximum high speed performance. The conventional solution to this is to separately adjust the threshold of these two groups of transistors using a photomasking level. The reverse poly DRAM process has been designed in terms of thermal cycles and layout such that these two criteria are simultaneously met without a separate tailoring threshold adjust implant masking step.

It is desired to improve yield and reliability and reduce manufacturing costs. This can be accomplished by reduced cycle times through fabrication, reduced total process inventory needed for a given run rate, more rapid response to process changes in volume quantities, more repeatable performance, and less number of steps to introduce variation. The process is shrinkable for subsequent generation products and the process flow fits in well with subsequent CMOS high density DRAM processes. The transistor structure is fully shrinkable while maintaining strong "long channel" characteristics, high performance, and minimal degradation with time (high reliability).

The process is compatible with today's IC fabrication equipment, not requiring exotic new equipment. It avoids problems with poly "stringers" or "sticks," a common problem with conventional DRAM process technology. The process reduces the number of high current implants from a conventional 2 to only 1 implant. This is a costly step in terms of both throughput and machine cost and is greatly advantageous to minimize. Self alignment of the cell capacitor dielectric region makes possible the use of a cell capacitor dielectric with reduced oxide thickness from the transistor gate oxide without having to define this with another masking level.

This same concept also makes it possible to use an alternative cell capacitor dielectric material with higher dielectric permeativity than conventional silicon dioxide. A higher permeativity dielectric results in increased cell capacitance per unit area. Higher cell capacitance improves immunity to single event upsets due to alpha particles or cosmic radiation. This results in higher operational reliability. It also reduces the amount of surface area needed for the cell capacitor, thus allowing for greater shrink and smaller die size. No extra photomasking step is required for this feature.

Poly 1 is used for the transistor poly and Poly 2 is used for the cell field plate poly. This is opposite of most other DRAM processes. As mentioned above, this approach offers advantages. The transistor poly photo patterning and etch critical dimension control is improved due to lack of concern for "stringers" and extra topography. "Stringer" problems are minimized since they are a factor only during Poly 2 etch.

Poly 2 etch for the reverse poly DRAM process is for patterning of the cell field plate which is a noncritical etch and can be done by a number of isotropic means. This insures complete etch removal of "stringers." The extra topography seen at Poly 2 etch is less a factor due to the less stringent cell plate poly etch tolerances required. Self-alignment is possible between the cell capacitor region and the access gate active channel region. There is less susceptibility to field oxide thinning between Poly 1 and Poly 2. The high current/high dose arsenic S/D implant is done prior to cell capacitor formation. This spares the cell cap of having to withstand the electric field stress present due to charging effects associated with the S/D implant. This is a major factor as cell dielectrics continue to thin and become more and more sensitive to E-fields present during processing. The reverse poly DRAM process also offers the following product performance advantages. The invention makes possible use of advanced transistor structures using LDD with flexibility for re-optimization when shrinking in the future. The transistor structure also minimizes high drain electric fields thus helping preserve device stability and long term reliability. The reverse poly DRAM process is highly compatible with subsequent generation (multi-megabit) CMOS DRAMs allowing multi-generation parts to run in the same Fabrication area. Flexibility in cell capacitor dielectric is made possible by having the option of independently varying the transistor gate oxide independent of the cell capacitor dielectric. This flexibility is made possible without adding a photomasking step.

A reverse poly process was developed, initially for an NMOS process in order to reduce mask steps and provide improved alignment of circuit components formed by the multiple mask steps of a DRAM process. An embodiment of that process which used two polysilicon layers is described in U.S. Pat. No. 4,871,688.

In that embodiment, a first layer of poly which was deposited is used for the transistor poly and a second layer of poly which was deposited is used for the cell field plate poly. This is opposite of most other DRAM processes, and has several advantages:

1) The transistor poly etch is always a critical etch step as its critical dimension has a strong influence on device parameters. It is done early in the reverse poly DRAM process where there is minimal topography. This provides the advantages of best control and repeatability of fine line patterning.

2) It avoids problems associated with residual poly after poly etch known as "stringers" or "sticks." These are caused by re-entrant areas remaining after a conventional Poly 1 oxidation. Anisotropic etch of Poly 2 can leave residual poly in these areas, resulting in Poly 2-to-Poly 2 shorts. This places extra constraint on the transistor Poly 2 etch of a conventional flow where critical dimension control, stringer elimination, and extra topography must all be dealt with simultaneously. The reverse poly DRAM process avoids this problem by having transistor poly on the first poly.

3) The second poly on the reverse poly DRAM process is for the cell plate and does not have the critical dimensional tight tolerance requirements that the transistor poly has. Thus it is possible to use isotropic processes for etch of the cell plate poly easily eliminating "stringer" problems. The extra topography present at Poly 2 is more easily tolerated with the less stringent cell plate poly etch tolerance requirements.

4) The Poly 1 access device is tungsten silicided on top of Poly 1 and the spacer oxide on the sidewall.

5) In any general process flow, isolation field oxide thinning is encountered in processing between the Poly 1 and Poly 2 levels. This results in reduced parasitic field device threshold and thus compromises the integrity of the electrical isolation. This can be a problem for the conventional (prior art) process flow where the transistor poly (Poly 2) sees the thinnest field oxide. With common bootstrapping and double bootstrapping circuit techniques used on DRAMs, voltages of 12-15 volts at $V_{CC}=6$ V are possible on some transistor poly gate circuit nodes. This can compromise high $V_{CC}$ margin. For the present invention, the transistor gate poly is formed from Poly 1. Minimal field oxide thinning is seen prior to Poly 1 deposition thus insuring an adequate field oxide thickness for transistor poly nodes. The normal thinning of field oxide seen prior to Poly 2 is not detrimental on the reverse poly DRAM process since Poly 2 is used only for the cell plate for the capacitor which is biased at DC ground.

6) The high current/high dose Arsenic S/D implant is done prior to cell capacitor formation. This spares the cell cap of having to withstand the electric field stress present due to charging effects associated with the S/D implant. This is a major factor as cell dielectrics continue to thin and become more and more sensitive to E-fields present during processing.

7) Transistor formation on the reverse poly DRAM process utilizes a unique technique for lightly doped drain (LDD) formation. The LDD regions are defined using an oxide spacer. This approach makes possible a dramatic reduction in device length without incurring the detrimental "short channel" effects seen with conventional approaches. Also, high electric field hot electron and hot hole effects are greatly reduced. This makes for more stable device characteristics over time and thus greatly improves device reliability. Thickness of the spacer is easily changed allowing greater flexibility for device re-optimization when shrinking.

8) Cell capacitance can be increased without adding masking steps using this reverse poly DRAM process sequence. The cell capacitor dielectric is formed after the transistors have been formed and encapsulated in oxide, top and side. Poly 2 is then deposited and etched. After the Poly 2 etch the dielectric is etched away from regions where the Poly 2 had been etched away. This self-aligns the cell dielectric underneath to the cell poly field plate.

9) The reverse poly DRAM process results in the manufacture of memory circuits in less photomasking steps than had previously been required. Additionally, fewer levels require stringent alignment and critical dimension control. The remaining levels are noncritical and afford rapid throughput with less stringent specifications. No extra mask step for $V_T$ adjust is required. This process requires only one high current implant, saving machine cost and floor space.

10) The reverse poly DRAM process flow is highly compatible with CMOS high density DRAM processes. This allows for ease in mutually running NMOS and CMOS steps together in the same fabrication area. Many of the furnace recipes, etch recipes, photo recipes, implants, and sputter recipes are identical, allowing NMOS and CMOS to run side by side. This last feature is particularly significant in the present invention, because the present invention is directed to a CMOS process.

In many transistor circuits, it is necessary to form both n channel transistors and p channel transistors, in a complimentary metal oxide semiconductor (CMOS) circuit. The present invention is directed to using the reverse poly process in fabrication of CMOS circuits.

SUMMARY OF THE INVENTION

According to the invention, a CMOS integrated circuit is fabricated, in which a first layer of polysilicon is used to form transistor gates, and capacitor cell plates are formed from a second polysilicon layer.

In the fabrication of the circuit, n wells are first formed by masking a semiconductor wafer and implanting an impurity. The impurity is intended to infiltrate to a sufficient depth to define the n well, as an n material of sufficient depth to permit the functioning of the p channel transistor circuit.

After forming the n wells, a thin layer of oxide, in the range of 250 α, is grown on the wafer to form an initial oxide layer. A first layer of polysilicon is deposited, and is used to form transistor gates. A second layer of polysilicon is used to form capacitor top plates. The application of the CMOS process to the reverse poly technique provides enhanced alignment of critical transistor gates and permits the use of less mask steps in fabricating the CMOS circuit.

Further advantages of the process includes an ability to place a barrier layer below capacitors by using the well implant step to dope the barrier layer into the substrate. This allows depletion mode capacitors to be formed without undue process complexity.

DETAILED DESCRIPTION OF THE PREFERRED EMBODIMENT

In order to fabricate a CMOS circuit, a p type wafer substrate 11 has a thin layer of initial oxide 13 grown or deposited, followed by nitride 15 in a blanket deposition. P wells are defined with photoresist and the nitride 15 is etched over n wells. This etching of the nitride will be used to define the n well areas and is deposited over unmasked areas which will define p type areas.

Figure 1:
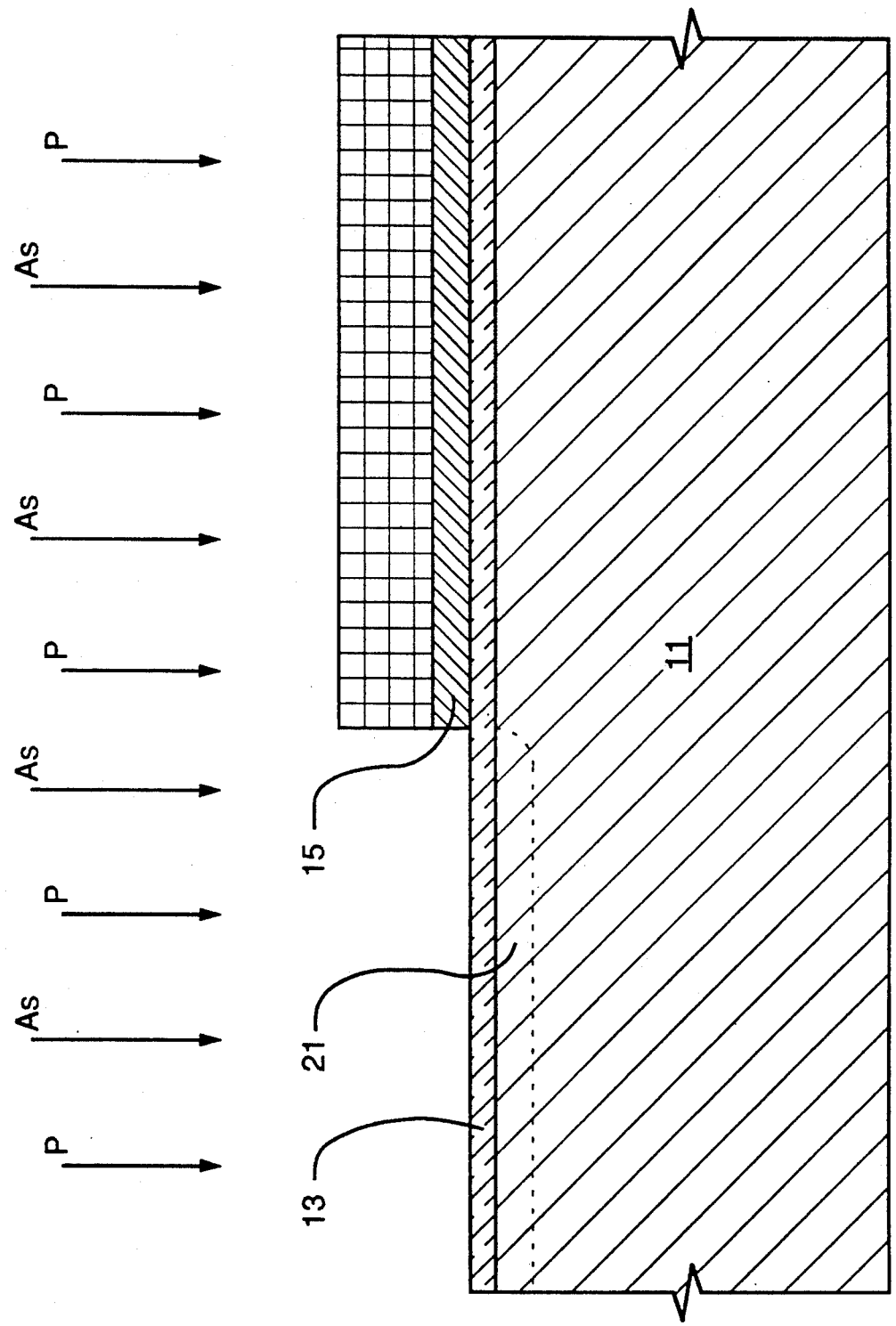
FIG. 1 shows a cross section of a semiconductor wafer with an initial nitride layer.

As shown in FIG. 1, the substrate 11 is then subjected to an n well implant in order to define n wells 21. The n well implant is a dopant which is selected to diffuse to a depth which defines the n well 21. Conventionally, this step is a high energy implant, with phosphorus chosen as an implant material because of its favorable diffusion coefficient. Alternatively, a combination of phosphorus and arsenic has been used. The use of arsenic improves the definition of the n wells and reduces short channel effects in p channel transistors.

Figure 2:
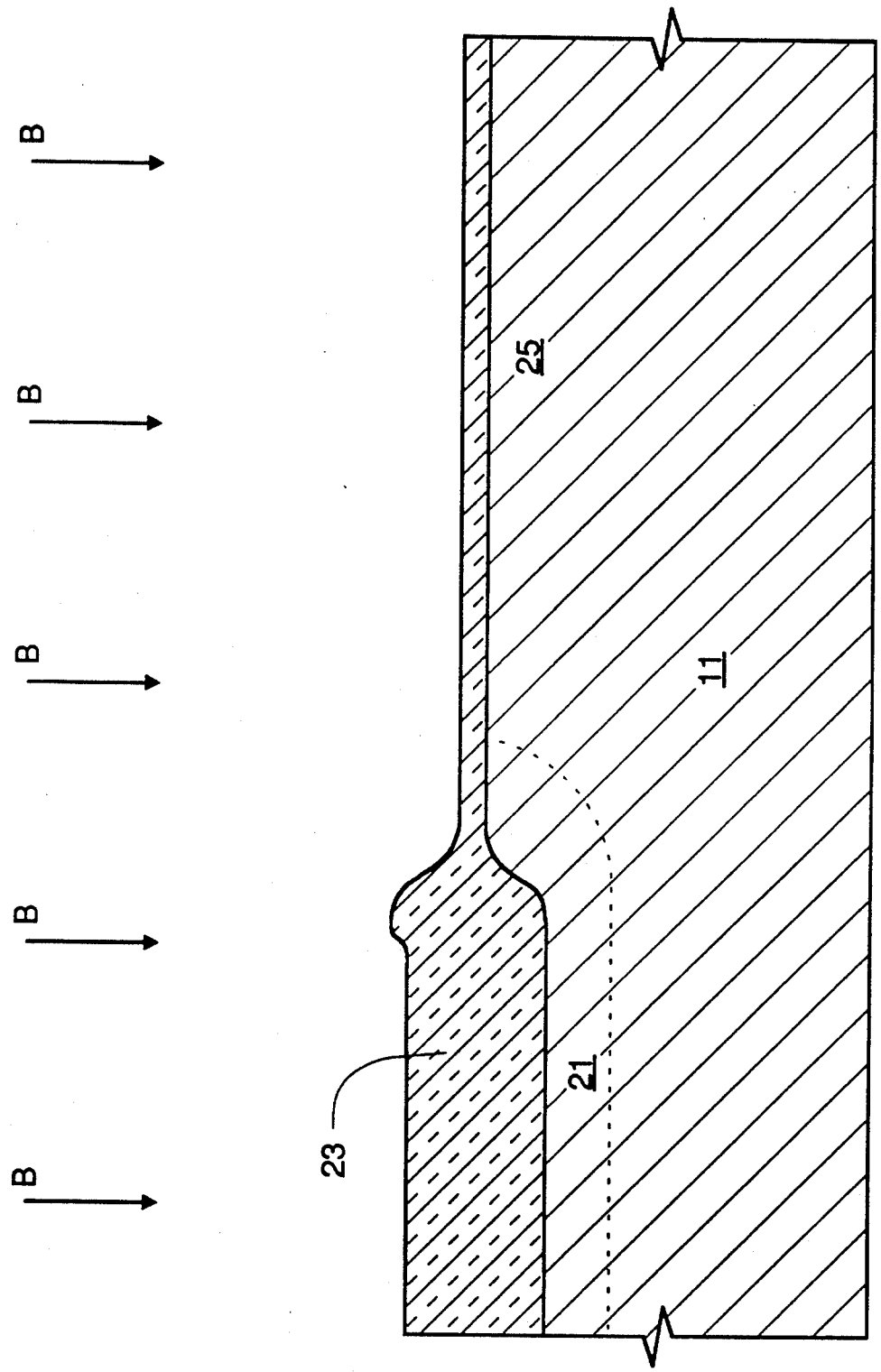
FIG. 2 shows a cross section of the semiconductor of FIG. 1 subsequent to n well deposition.

Referring to FIG. 2, after the diffusion, an n well steam oxidation step is used to form an oxide layer 23 over the n wells. After the steam oxidation, the nitride 15 is removed from the p type areas and a p well implant is applied in order to better define the p areas, indicated at 25. A preferred dopant for the p well implant is boron. This is followed by an n well drive, in which the n well dopant 21 is driven to a satisfactory depth in the substrate 11.

The example given is that of a CMOS process which uses p type silicon as the starting material. If n type silicon were used, the process steps would be virtually identical, with the exception that in some cases, dopant types would be reversed. The appearance of the figures using an n type starting wafer would be the same as for the described p type starting wafer.

Figure 3:
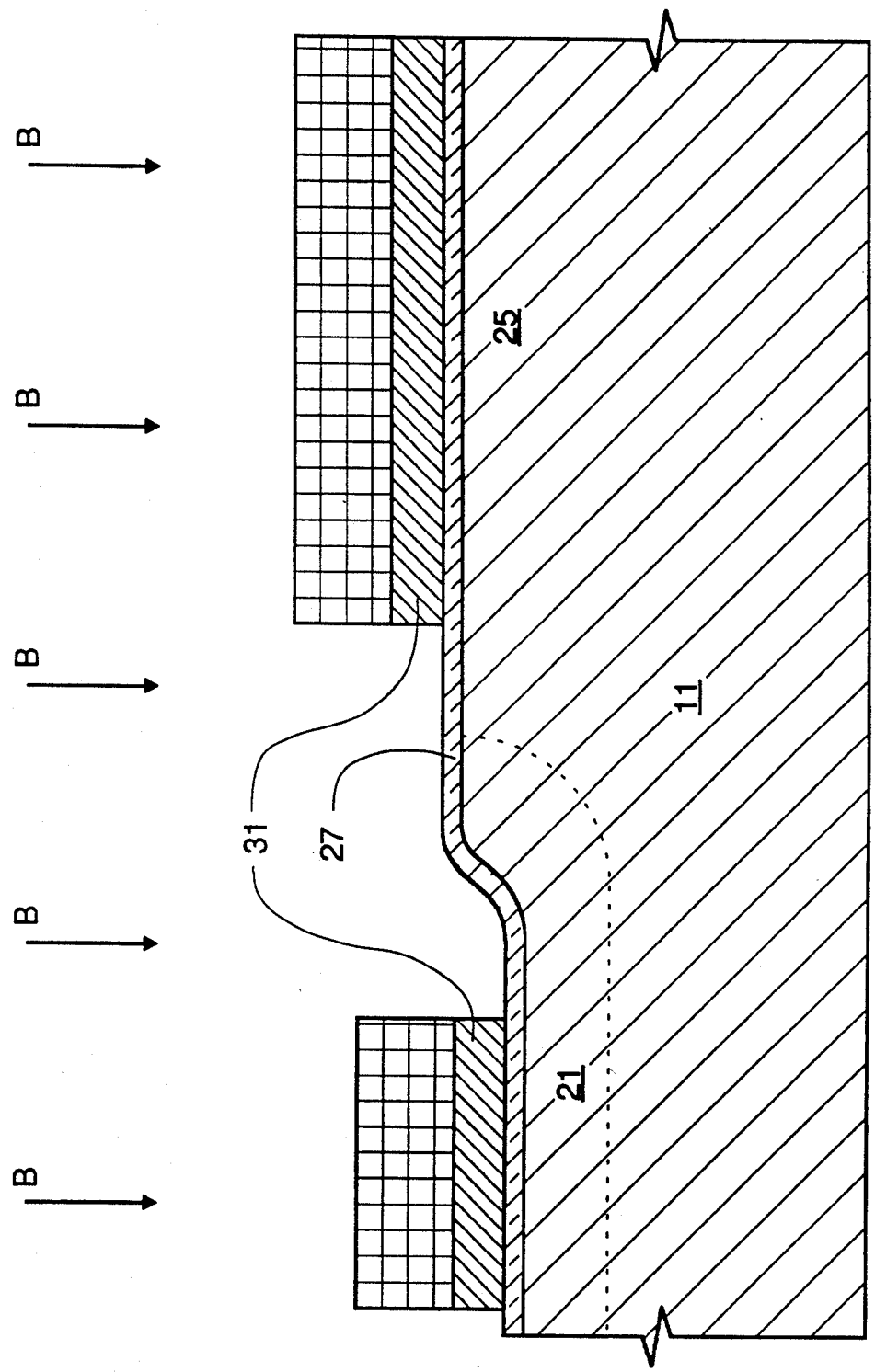
FIG. 3-5 show active area and field definition, including field enhancement implant and field oxide growth

The oxide 23 is stripped from the n wells 21, leaving the n wells at a lower depth than the adjacent p areas, which can be seen on FIG. 3. The oxide strip is followed by a gate oxide growth, in which a thin layer (about 275 α) of oxide 27 is redeposited on the wafer 11.

Nitride 31 is again deposited on the wafer in a blanket deposition. This nitride 31 is masked and etched, in order to define active area. The active area is located where the nitride 31 is masked. Therefore, the definition of active area is accomplished by etching the unmasked nitride.

Figure 4:
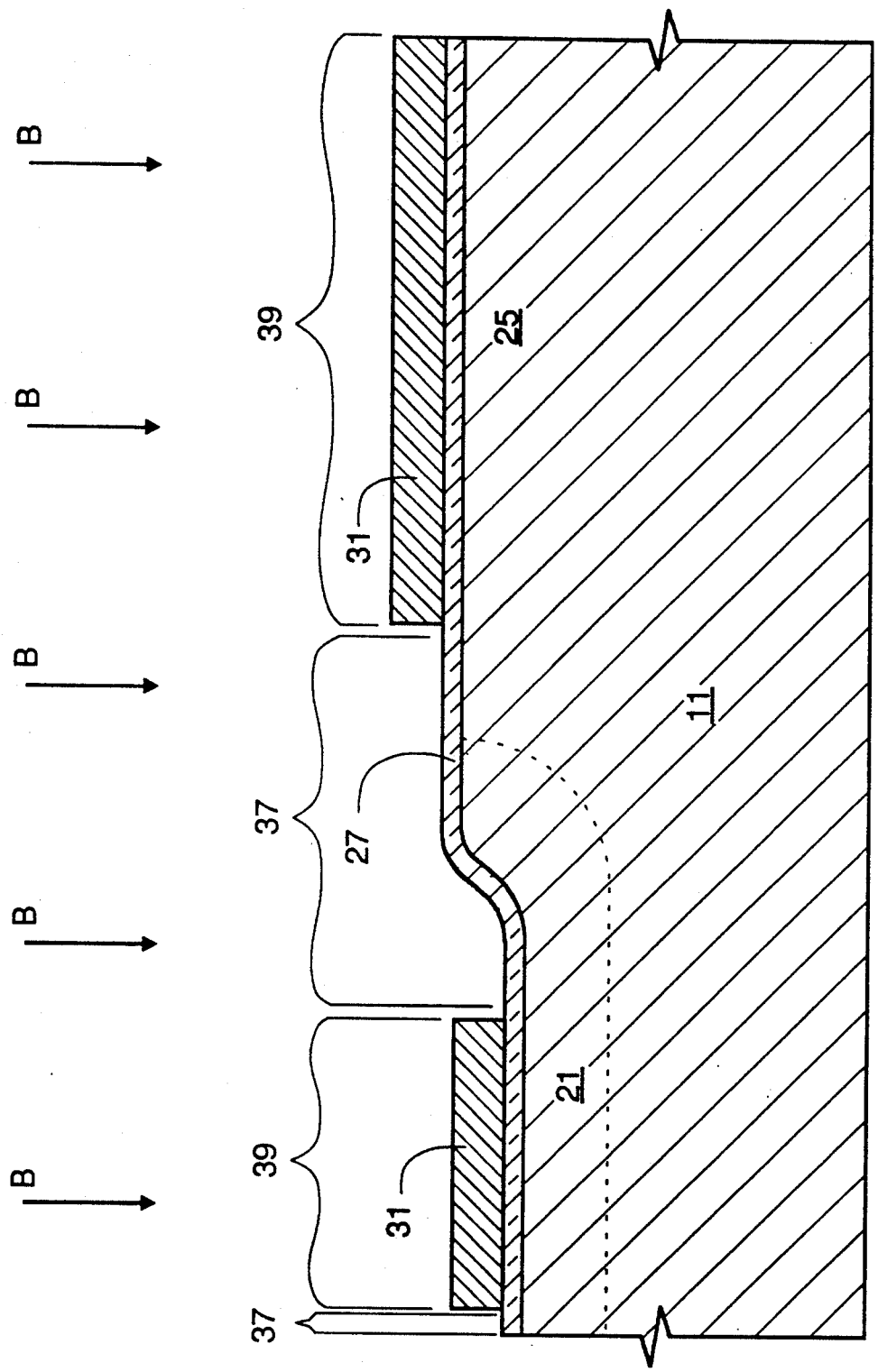

Referring to FIG. 4, a channel stop implant is applied to the wafer, using boron. The resist over the nitride 31 is removed either before or after the application of the channel stop implant, but the nitride substantially reduces the implantation of the boron in the nitrided areas. The channel stop implant therefore dopes the wafer 11 in the active areas, shown at 37, but the nitride 31 over field areas, shown at 39, prevents the implant material from penetrating into the wafer 11.

Figure 5:
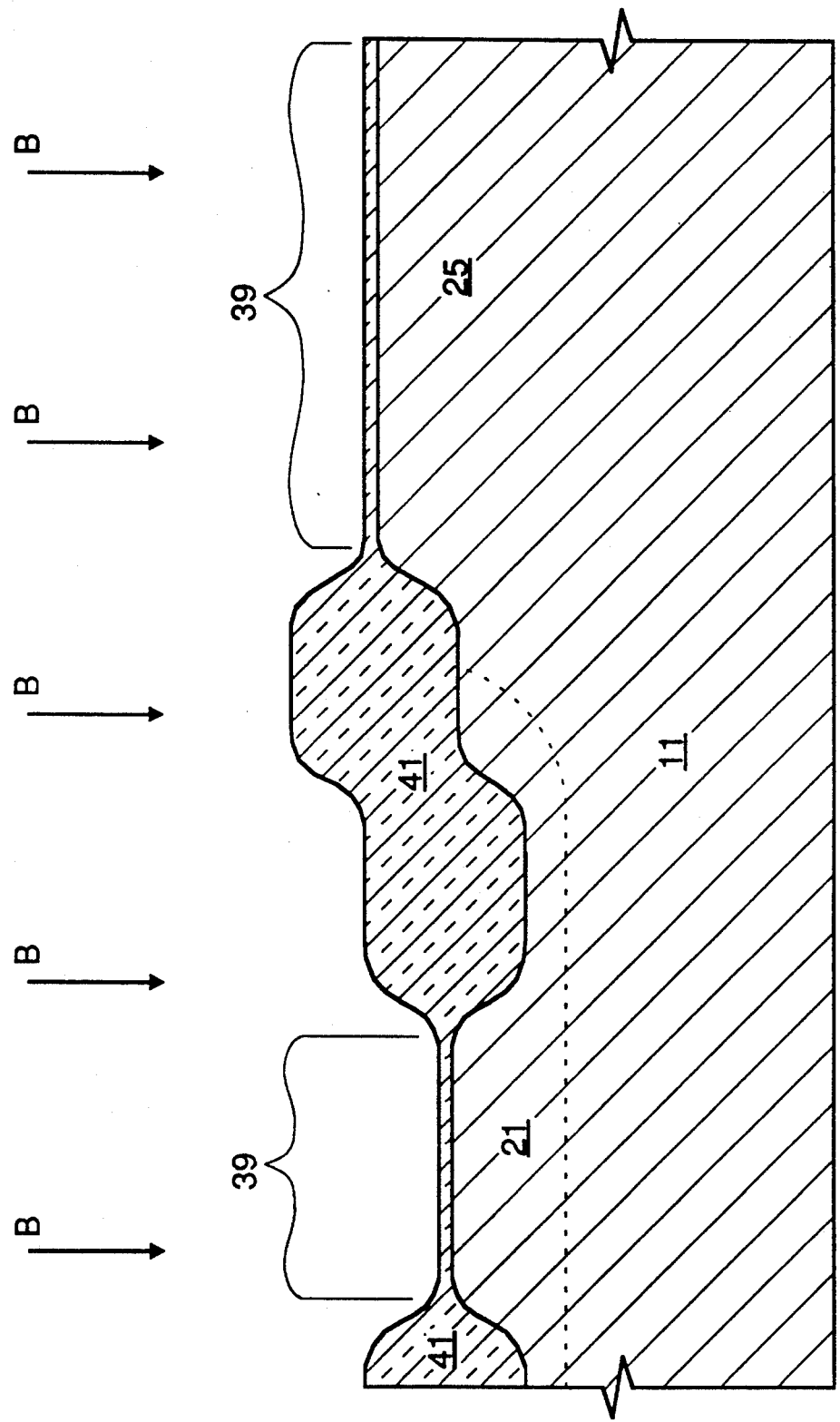

Referring to FIG. 5, the wafer 11 is oxidized in order to form a field oxide 41 in the field areas 37. The nitride 31 is then stripped in a wet strip step.

An enhancement implant is then applied to the wafer 11. The enhancement implant is preferably a boron implant and, since the field oxide is relatively thick, is applied mostly to active area 39.

Figure 6:
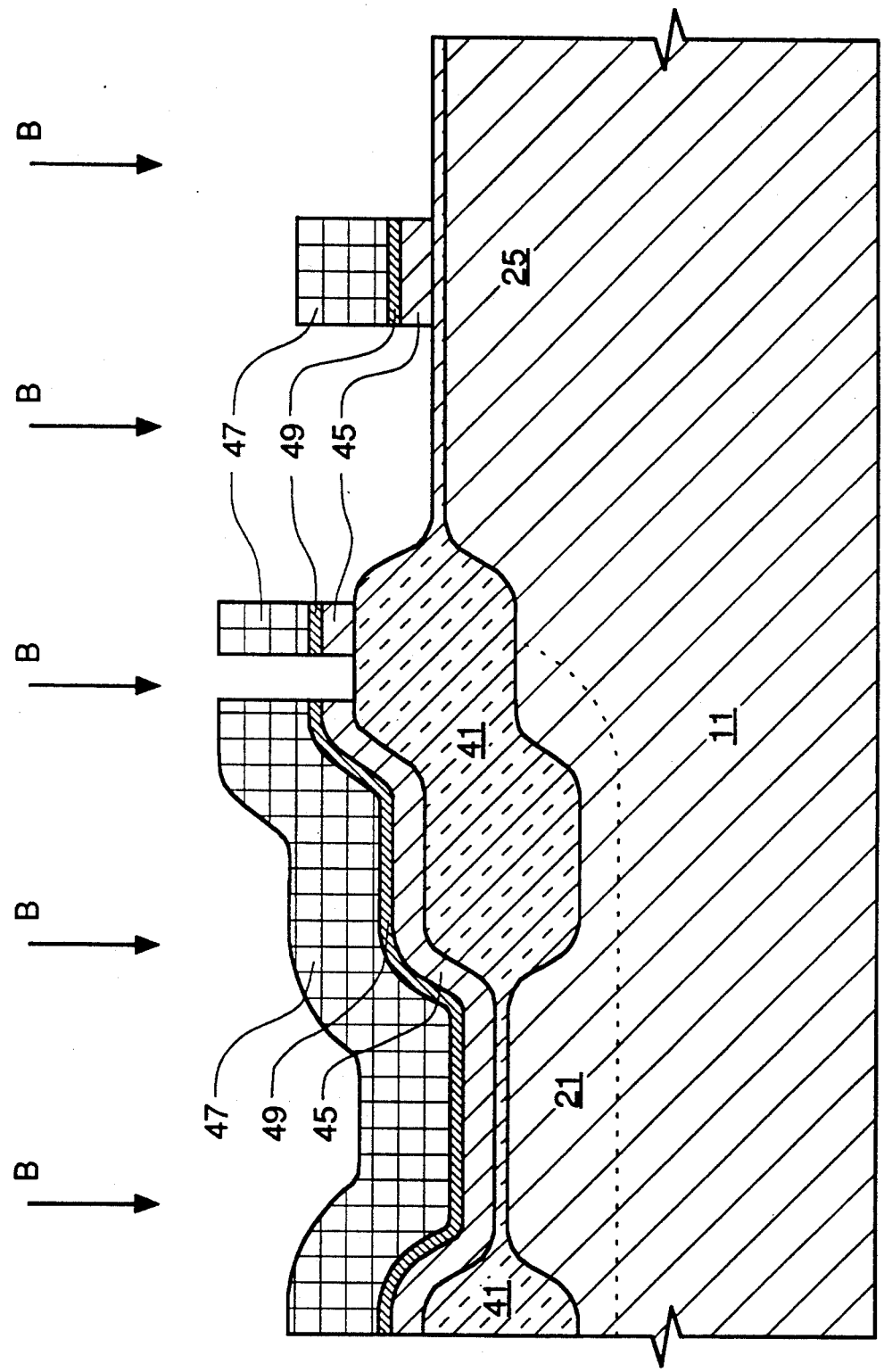
FIGS. 6-8 show Level 3, involving interpoly layer oxide deposition, access transistor and peripheral transistor photo patterning.

The wafer 11 is now ready for a poly deposition. The poly deposition is a deposition of polysilicon which is masked and etched in order to deposit a first layer of polysilicon (Poly 1) 45. This is shown in FIG. 6. The layer of polysilicon 45 forms transistor gates. In the preferred embodiment, a silicide process is used in order to enhance the conductivity of Poly 1. This is accomplished by applying a refractory material, such as tungsten 47 over the poly 45 after the poly 45 is patterned. The tungsten 47 reacts with the poly 45 in order to form tungsten silicide. The unreacted tungsten and tungsten oxide is then etched, leaving a thin layer of tungsten silicide 49.

The polysilicon 45 is patterned only in the n channel areas, which are over p type material. The n channel has a blanket layer of poly 45 over it, along with blanket layers of the silicide materials 47, 49.

A blanket implant consisting of boron is applied to reduce short channel effects in the transistors in the n channel regions. This is sometimes referred to as a halo implant. Because the poly completely covers the n wells, the halo implant is effectively only applied to the p type material.

The halo implant is applied after poly 1 45 is applied but preferably before subsequent oxidation steps.

Figure 7:
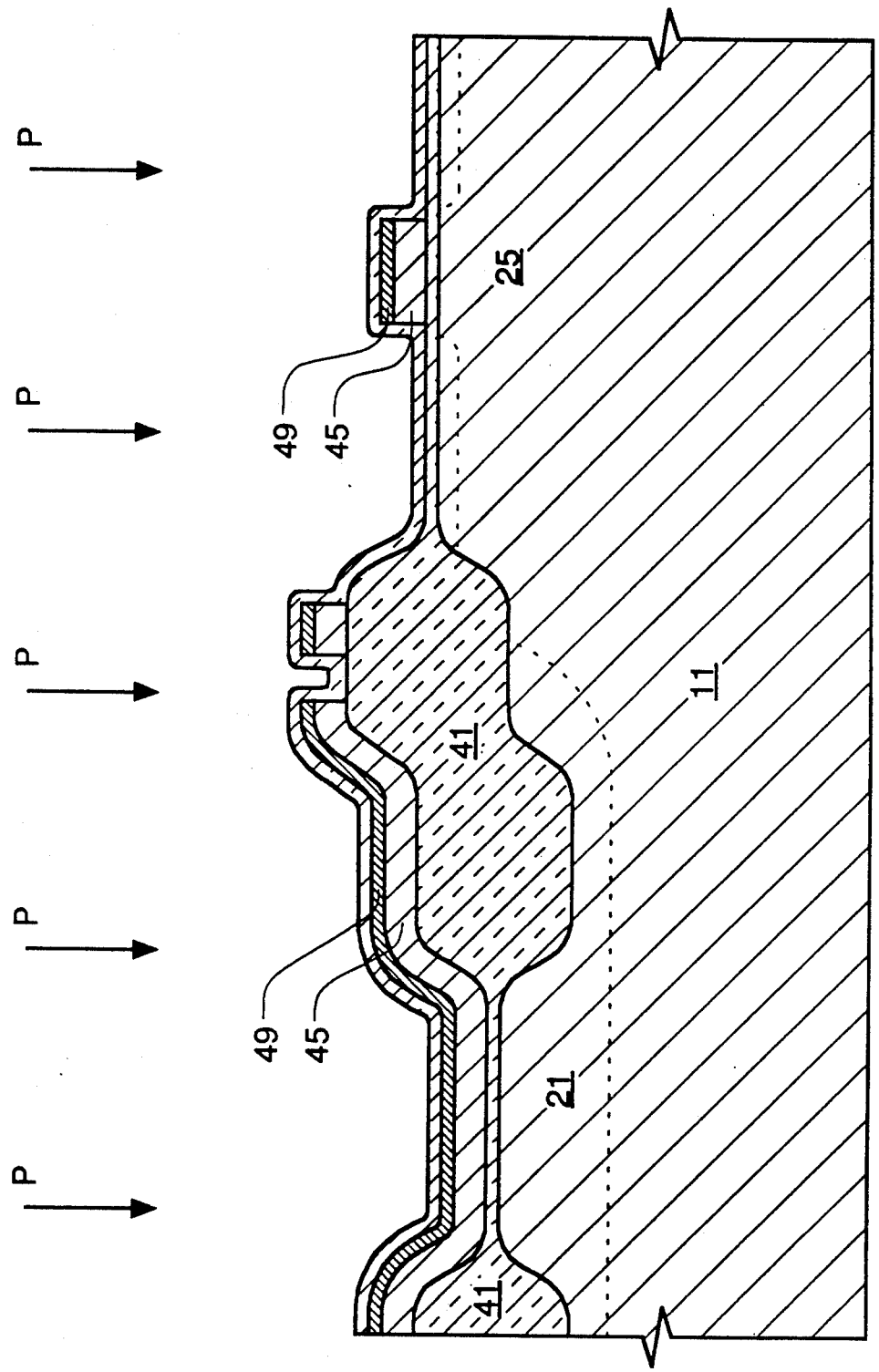

Referring to FIG. 7, oxide is grown over the source/drain regions of the n channel transistors in order to improve n channel reliability. At this time, a self-aligned phosphorus implant is applied as a blanket implant in order to form lightly doped drain structures in the p wells. The lightly doped drain structure is an n- region and helps define the transistor sources and drains.

Figure 8:
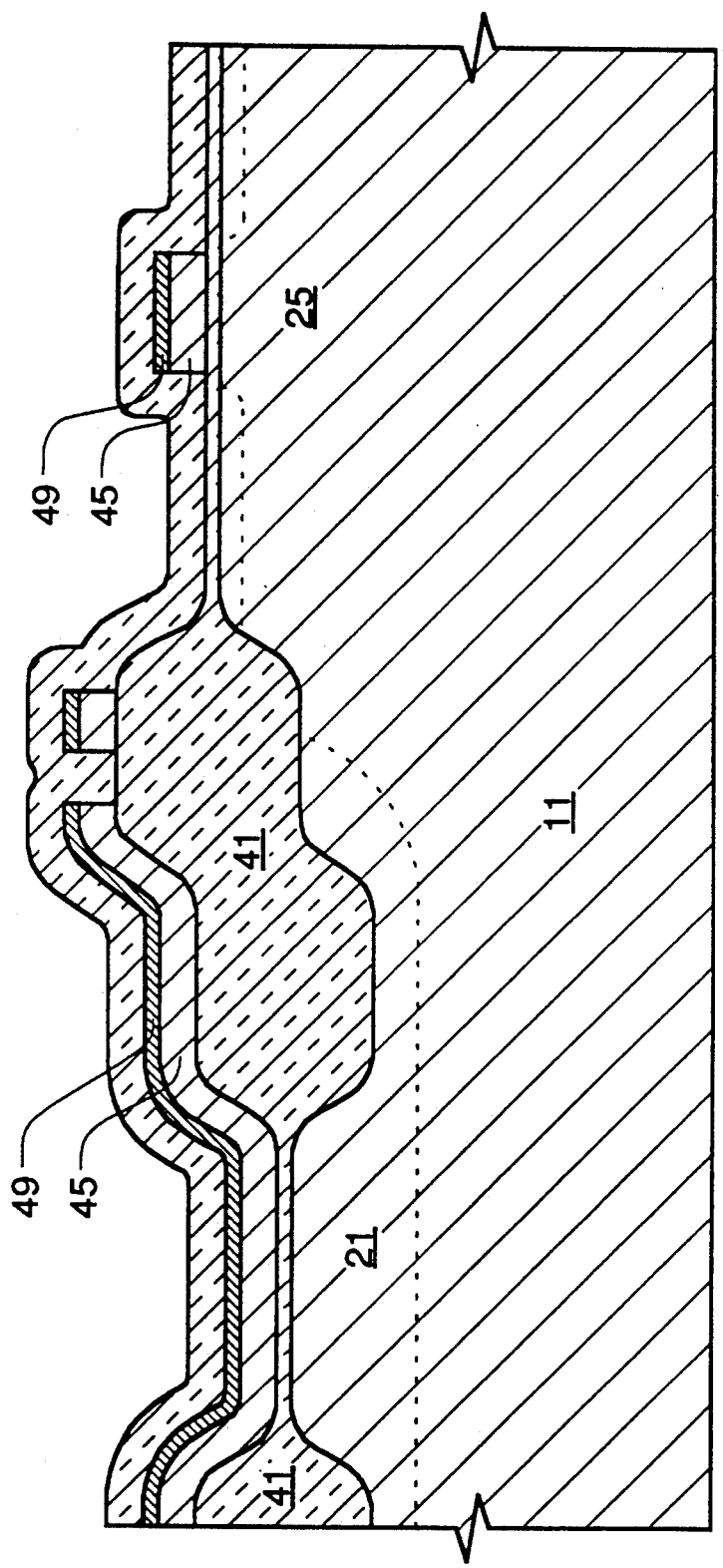
Figure 9:
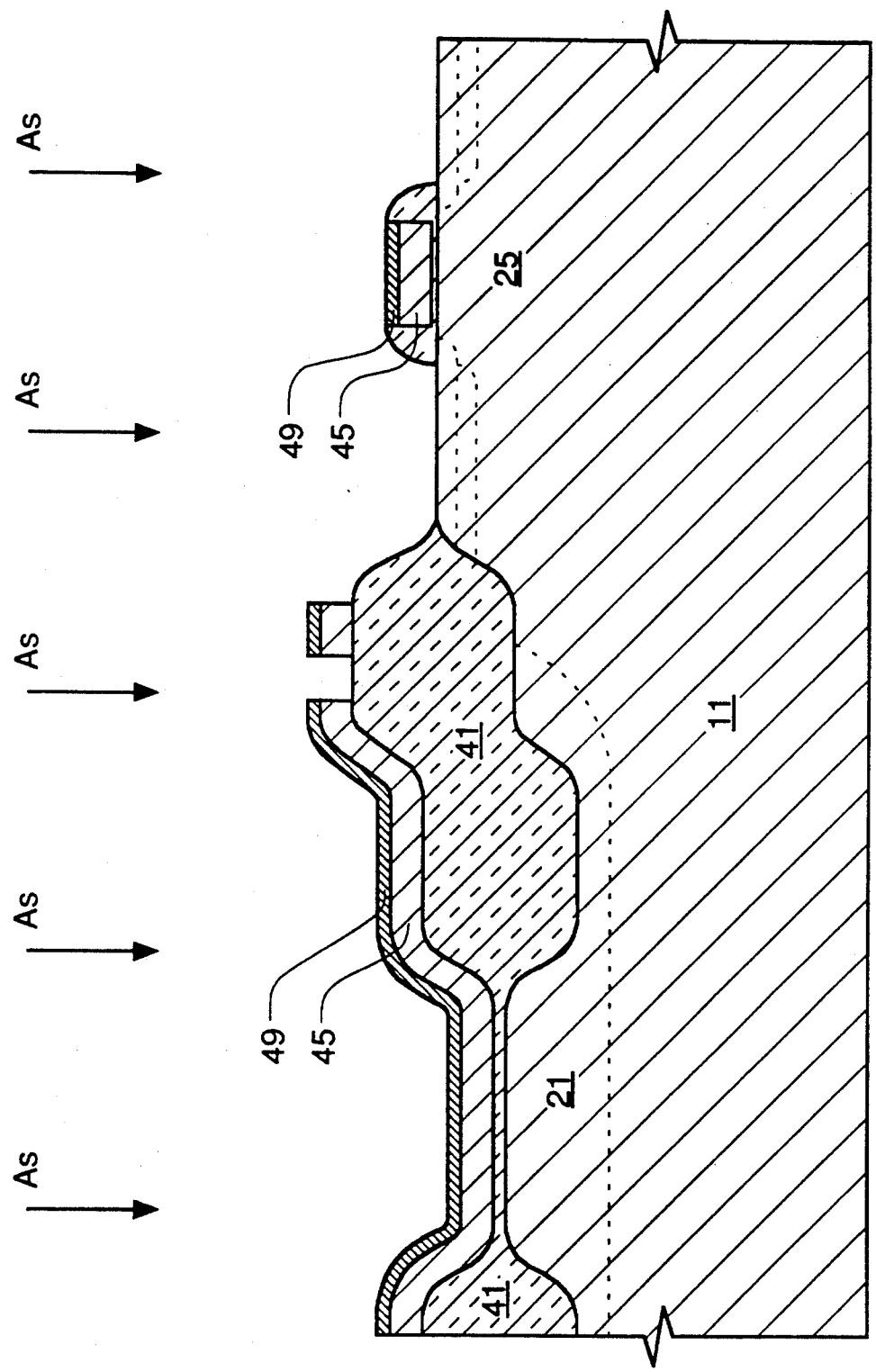
FIGS. 9-11 show oxide and poly stack anisotropic dry etch, resist removal, LDD transistor implants and drive.

After the lightly doped drain implant, a thick spacer oxide is formed, as shown in FIG. 8 and etched as shown in FIG. 9. An n channel source/drain implant is then applied to the p areas, using an arsenic implant material.

Figure 10:
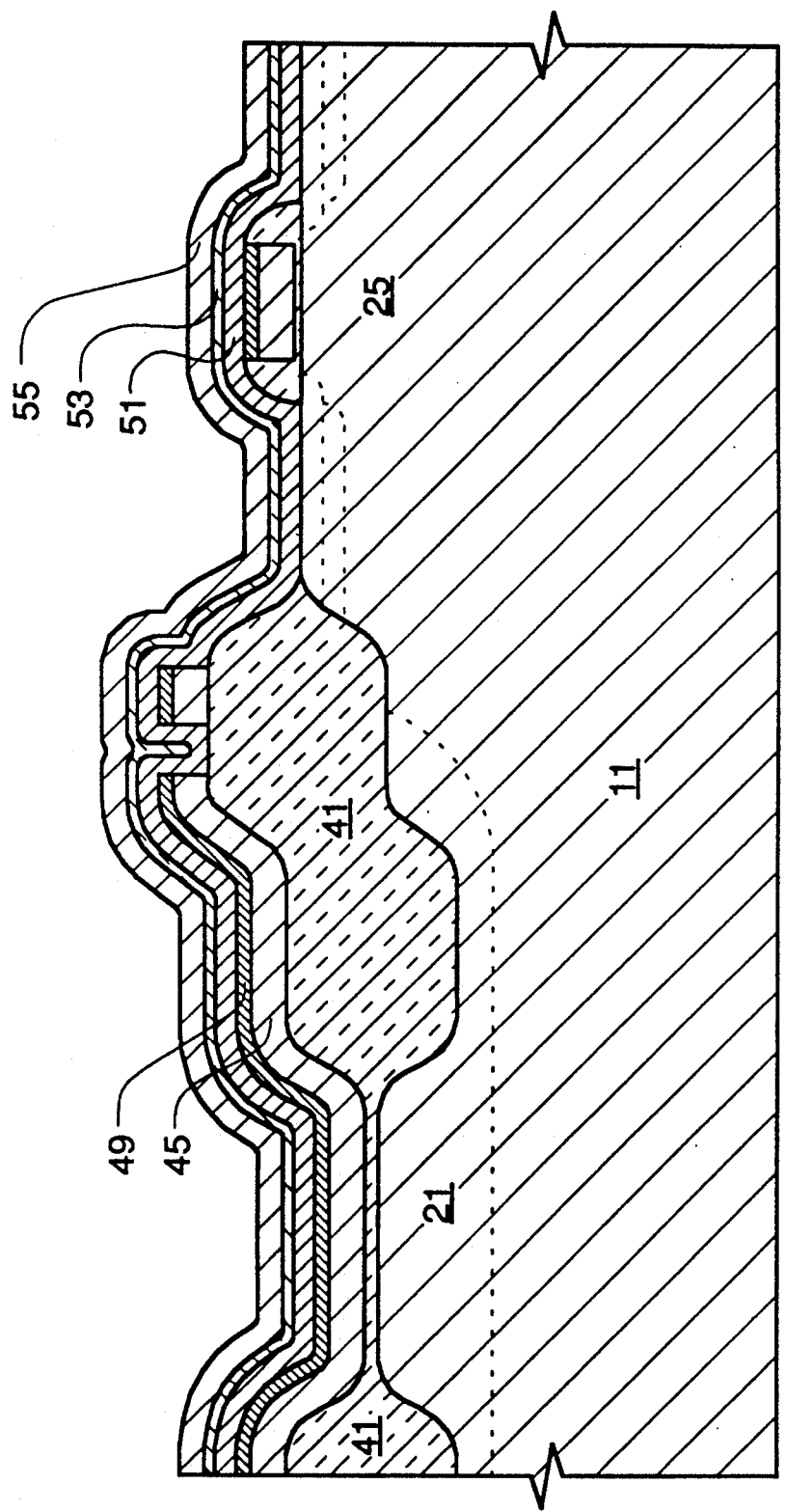

As shown in FIG. 10, this is followed by a nitride deposition step, which forms a cell dielectric 51. A subsequent layer of oxide 53 may then be deposited in order to provide more stability to the dielectric, followed by a second poly layer (Poly 2) 55. Poly 2 is doped with phosphorus to form Poly 2 as an n type material.

Figure 11:
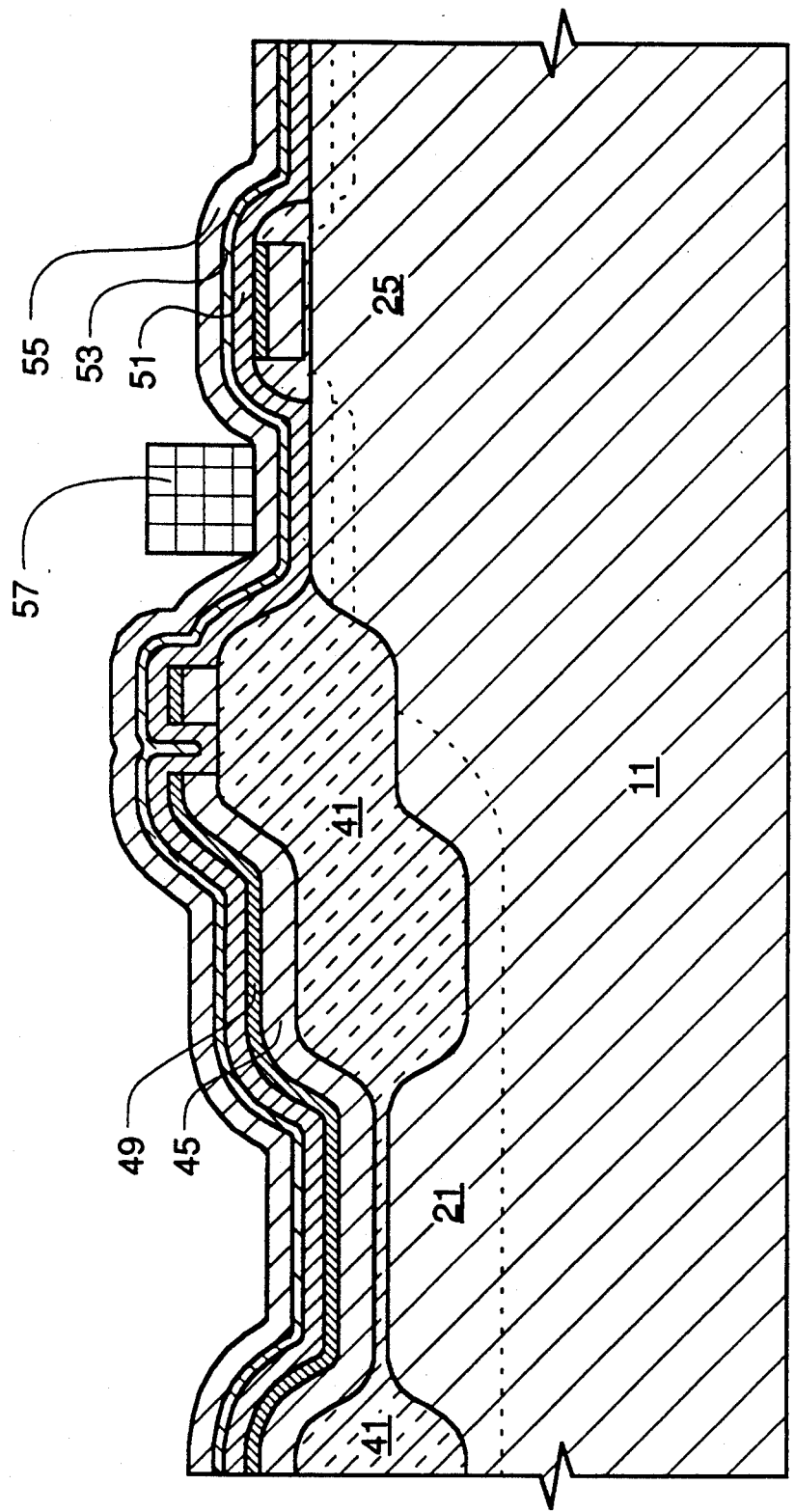
Figure 12:
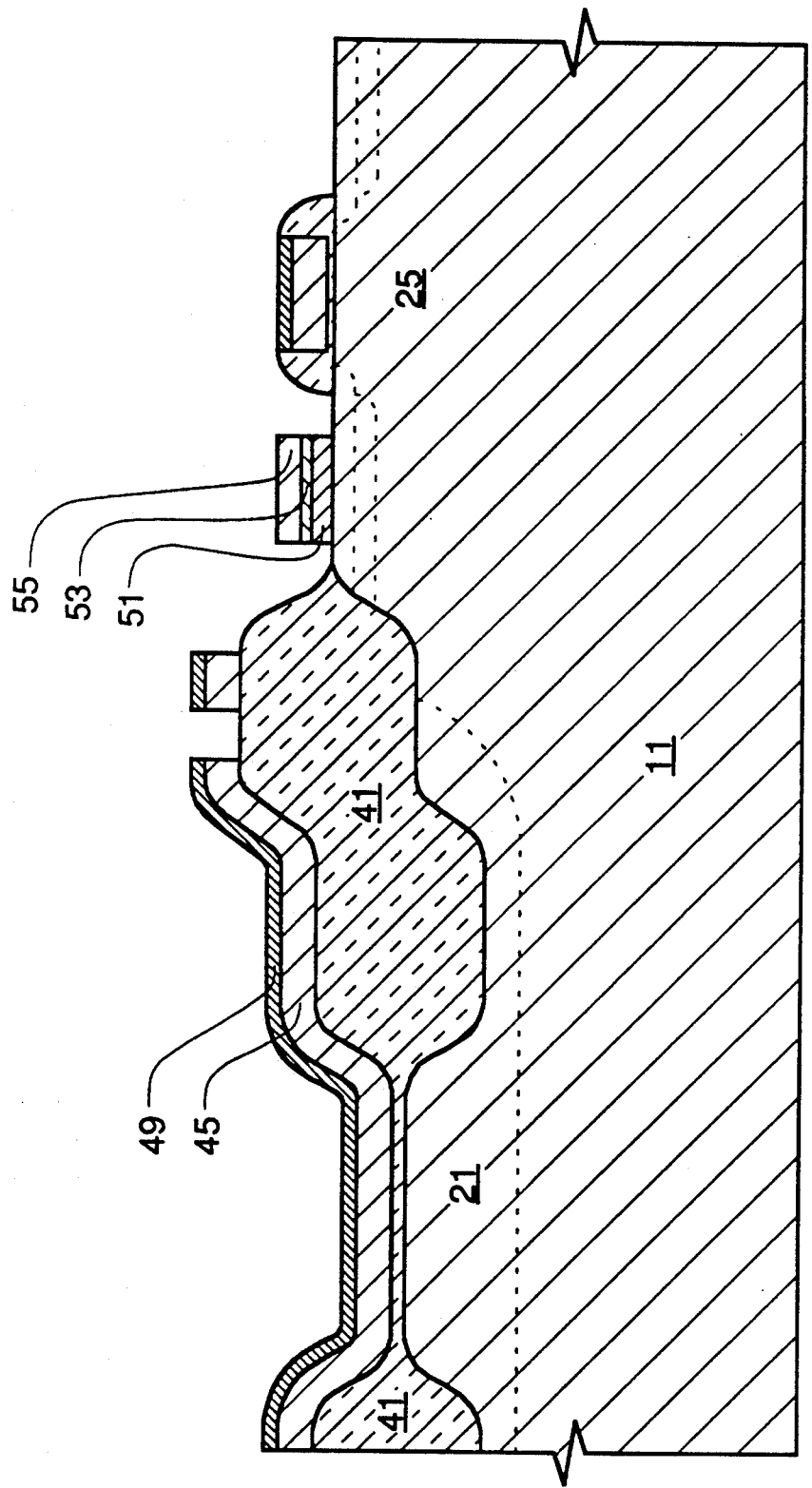
FIG. 12 shows spacer oxide deposition and spacer anisotropic dry etch.

The cell poly is then defined by a photomask 57, as shown in FIG. 11, and poly 2 55 is etched and the photoresist is stripped, as shown in FIG. 12. The exposed nitride, with its thin oxide coating 53, is then stripped, but nitride 51 remains over the first layer of poly 45 to protect the first layer of poly 45 during the poly 2 etch.

Figure 13:
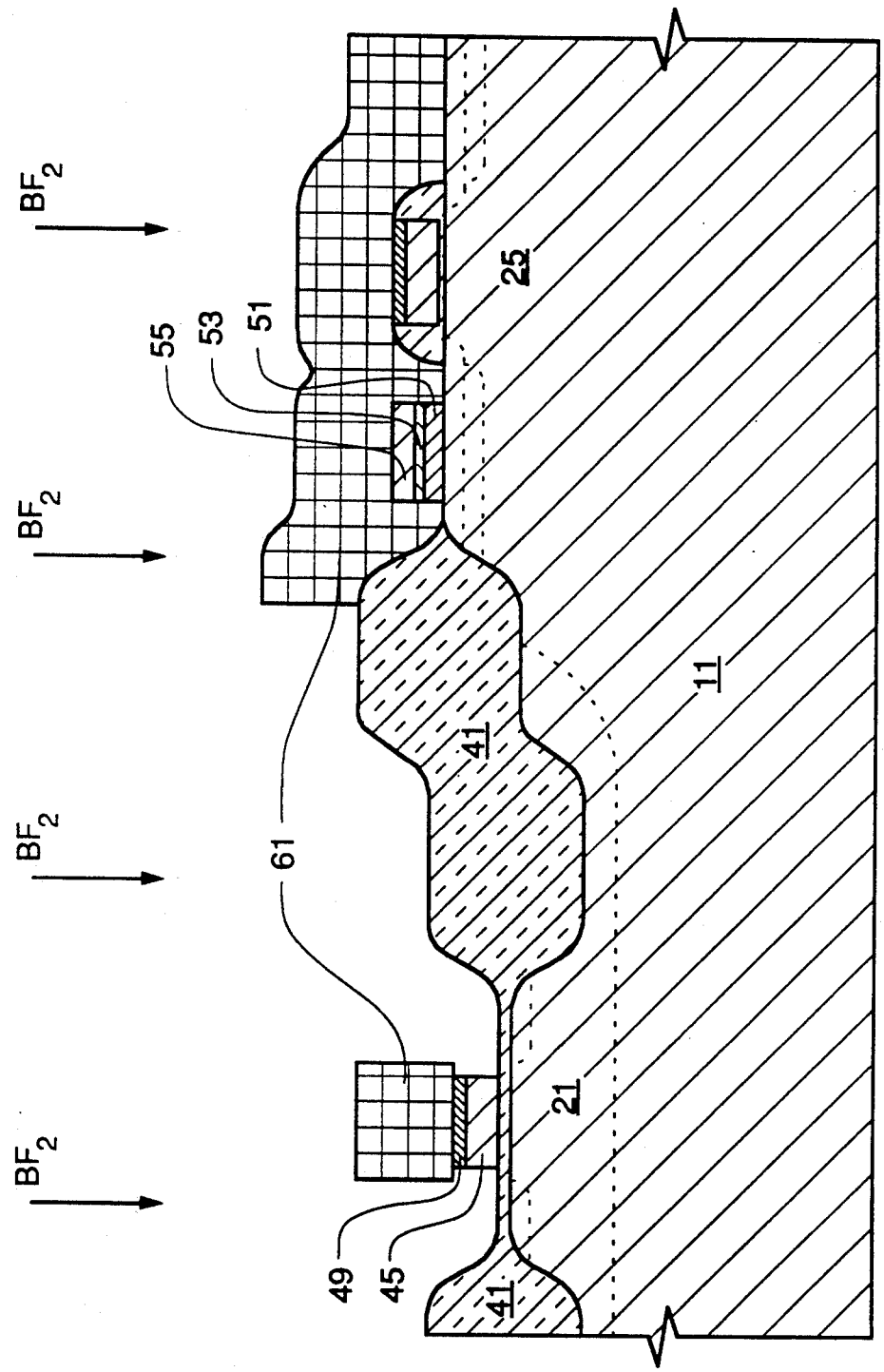
FIG. 13 shows cell capacitor dielectric formation.

Referring to FIG. 13, a photomask 61 is applied to define the p channel device. Photomask 61 remains over the n channel (p type areas), and as well as over the p channel poly, but has its open (unmasked) areas over the n well. The p channel device is etched in an undercut etch, but the photoresist is not immediately stripped. A p+ implant is applied, using a dopant such as boron, carried in BF2. Since the p well is covered by resist, the BF2 has little effect on the p type areas.

Figure 14:
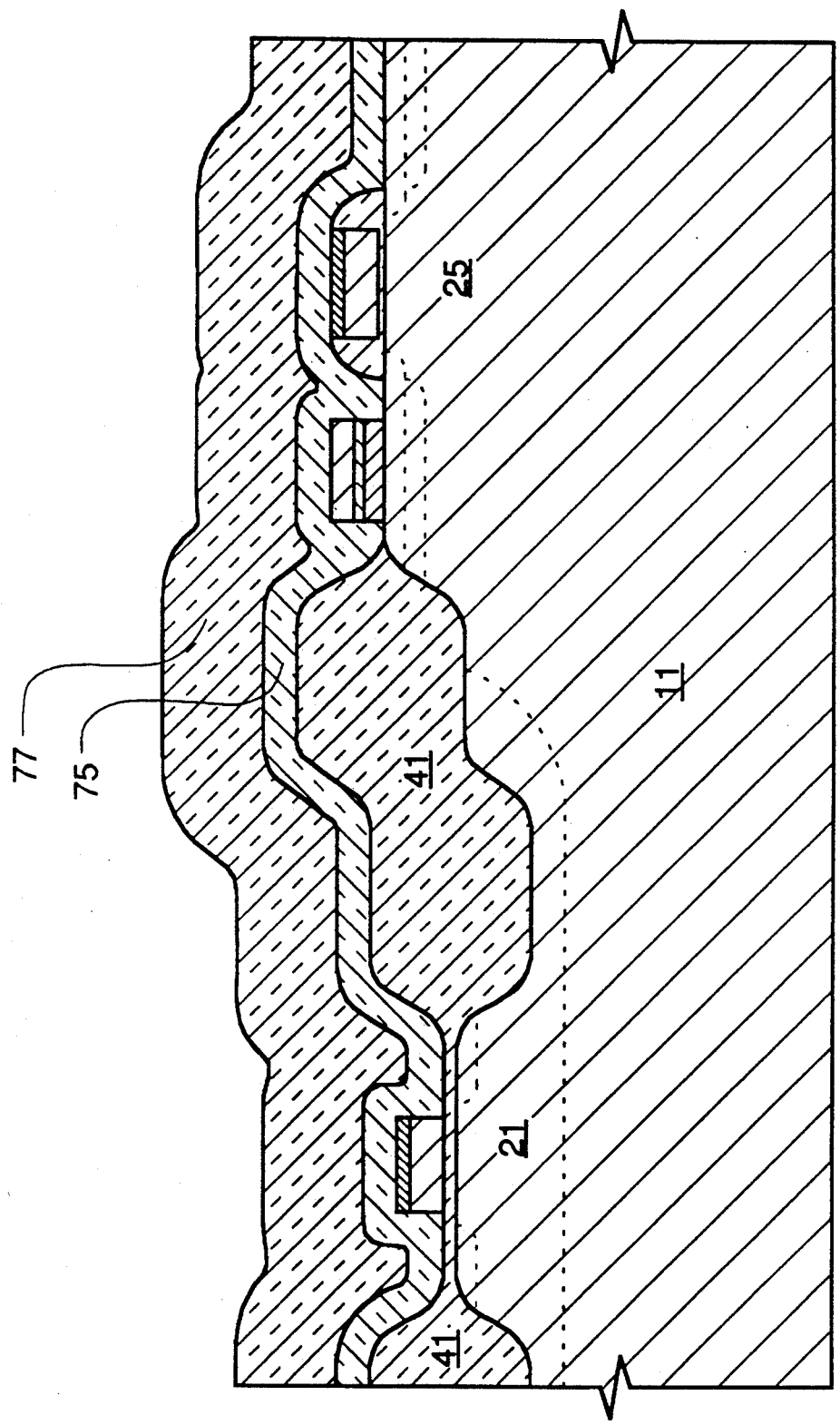
FIGS. 14 and 15 show Level 4, involving cell plate photo patterning.
Figure 15:
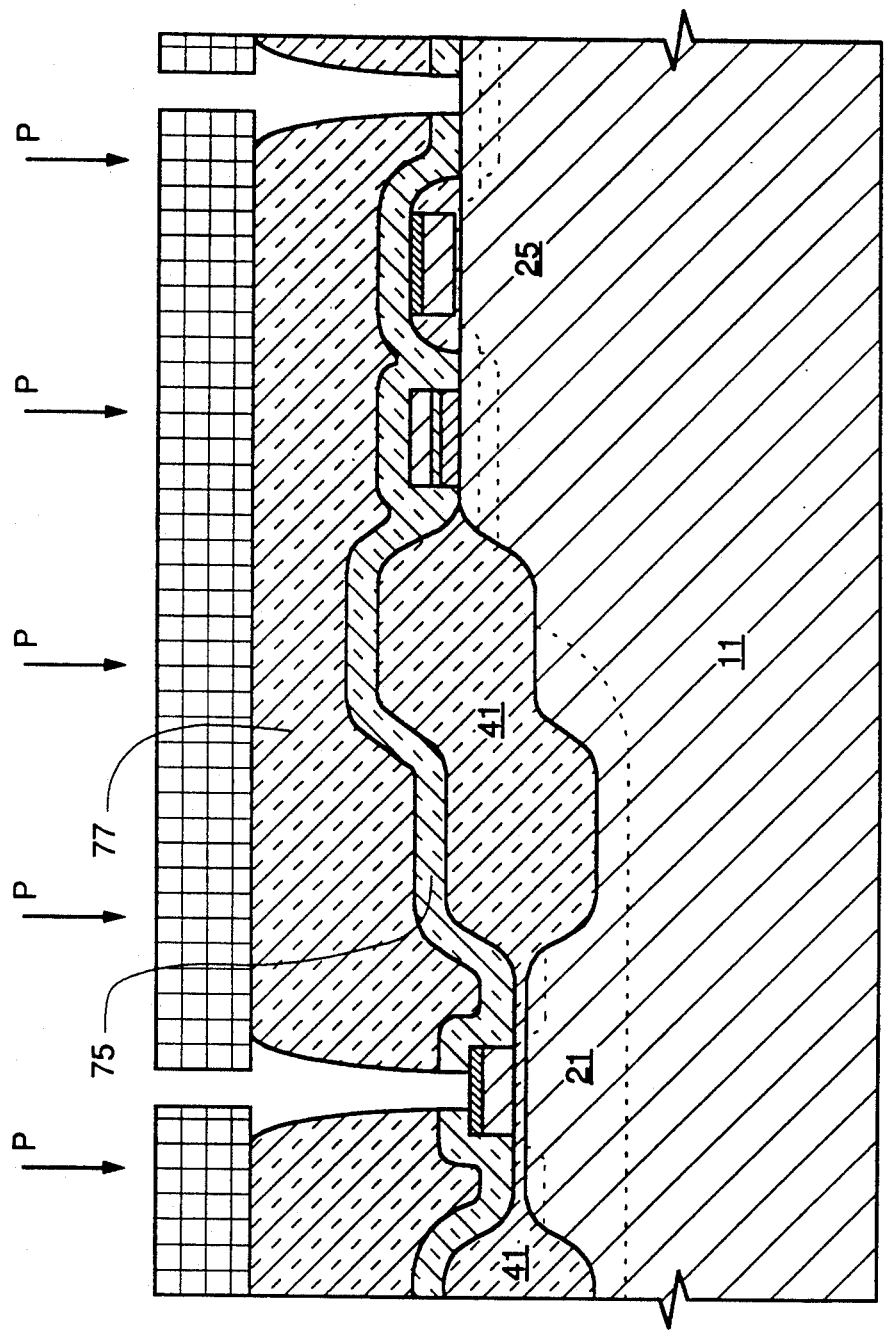

Referring to FIG. 14, TEOS oxide 75 and BPSG 77 is applied to the wafer 11 after the photoresist 61 is stripped. The BPSG 77 is reflowed, as shown in FIG. 15, and contacts are defined and etched in a wet/dry combination etch through the BPSG 77 and TEOS oxide 75. A plug implant, using phosphorus, is used to avoid misalignment of the contacts by using the alignment of the TEOS to guide the plug implant material.

Figure 16:
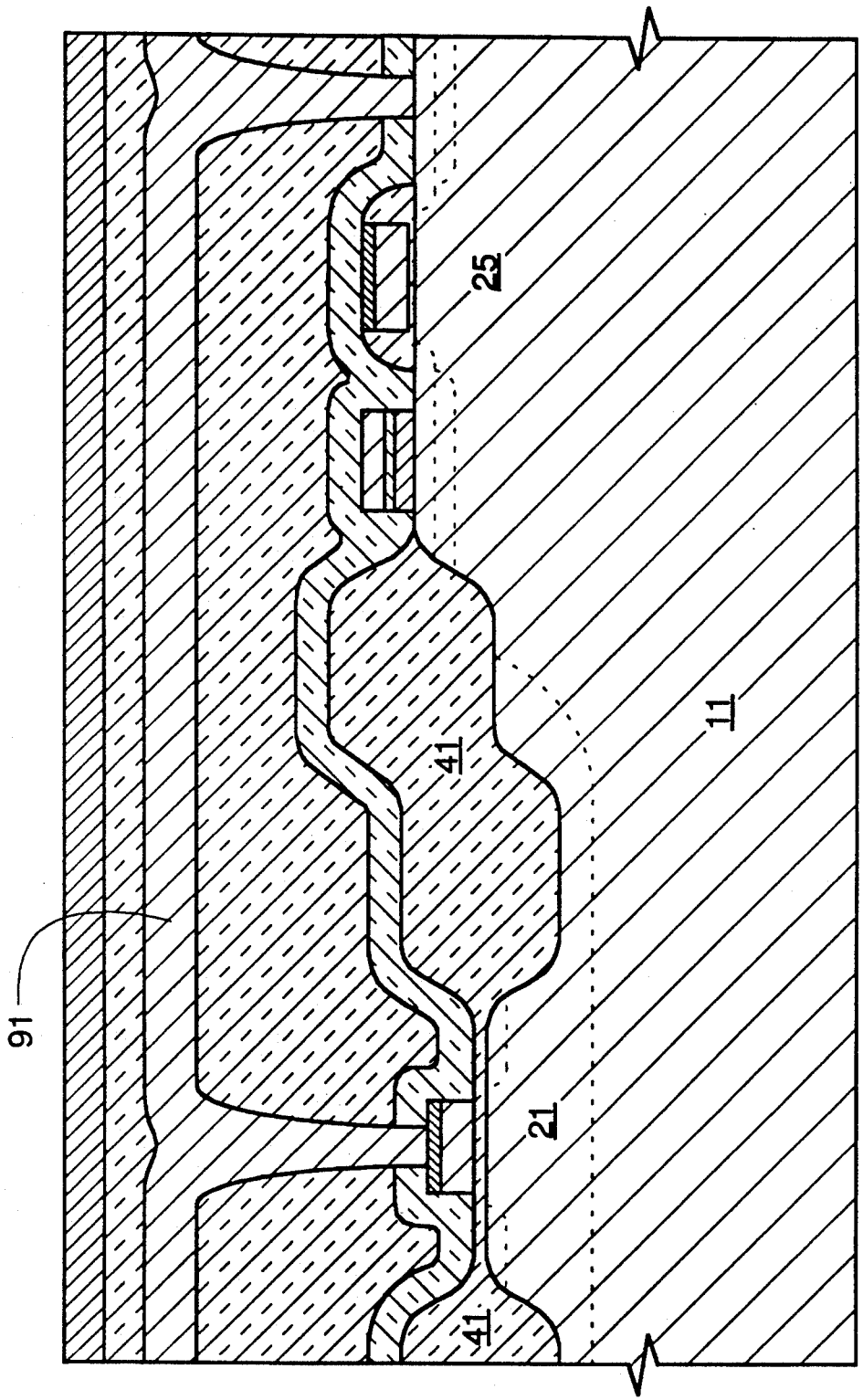
FIG. 16 shows Levels 5, 6 and 7, which include conventional contact, metal, and bond pad formation.

As seen in FIG. 16, a metal layer 91 is then deposited and establishes electrical continuity with the contacts. This is followed by defining the metal line, stripping resist, and annealing of the metal and passivation. The passivation at this point, (not shown) may be etched on the completed semiconductor structure.

What has been described are very specific steps used in constructing the preferred embodiment of the invention. The process described includes eight photomasking steps:

1- n well definition (or p well definition)
2- active area
3- buried contacts
4- Poly 1
5- Poly 2
6- metal contacts
7- metal
8- bonding pads Clearly, other steps may be taken within the scope of the invention in order to accomplish either same or different circuit results. For example, it is possible to incorporate the use of a blanket implant in order to establish the wells, such as is described in U.S. Pat. No. 4,839,301, to Ruojia Lee. (That patent disclosure is incorporated by reference herein.) Accordingly, the invention should be read only as limited by the claims.

We claim:

1. Method of forming DRAM semiconductor circuit devices which include, as a part of each device, a plurality of memory cells and access devices to control signals, the cells and access devices forming a repeating pattern on the device, the method comprising:
   a) preparing a silicon substrate which will be of a first conductivity type;
   b) applying a protective layer on the substrate;
   c) using a photomask to define a region on the substrate to be implanted with an impurity in order to create a well region of semiconductor material of a second conductivity type;
   d) using a photomask to define active areas for devices of both channel types;
   e) growing field oxide;
   f) removing said photomask which was used to define active areas;
   g) forming a polysilicon film, as a first polysilicon layer;
   h) implanting transistor sources and drains subsequent to said removal of the photomask which was used to define active areas;
   i) substantially etching said first polysilicon layer in the region of the substrate which is outside of the well region, to define a pattern of transistor gates and lines to access devices from polysilicon in said region;
   j) forming a capacitor dielectric layer over the substrate;
   k) depositing a second layer of polysilicon over the capacitor dielectric layer subsequent to said etching of said first polysilicon layer;
   l) etching said second layer of polysilicon in the region of the substrate which is outside of the well region subsequent to said deposition of the second layer of polysilicon, thereby forming capacitor plates over the capacitor dielectric layer in said region, so that each of said capacitor plates extend over at least one of said transistor sources and drains;
   m) applying a photomask over the region of the substrate which is outside of the well region, said photomask also defining devices in the well region;
   n) etching the polysilicon in the well region through said photomask after the etching of the second layer of polysilicon outside of the well region and after the implanting step to form sources and drains outside of the well region; and
   o) applying an impurity of the first conductivity type to the etched polysilicon in the well region.

2. Method as described in claim 1, further comprising:
   a) forming a second protective layer over the well region;
   b) applying an impurity to the substrate in order to establish the substrate as being of the first conductivity type in a region of the substrate which is outside of the well region, the second protective layer preventing said impurity from being applied to well region;
   c) forming an insulation film on a surface of the substrate, said step of forming the insulating film including the formation of gate dielectric in the active regions; and
   d) forming the polysilicon film which forms the first polysilicon layer, over said insulating film.

3. Method as described in claim 2, further comprising:

a) subsequent to applying an impurity of the first conductivity type to the etched polysilicon in the well region, forming an insulating film over the substrate;
b) removing a portion of said insulating film from said substrate surface to expose a portion of the substrate; and
c) forming a conductive layer over the substrate.

4. Method as described in claim 2, further comprising:
forming a buried contact at the location that the surface of the substrate is exposed, said forming a buried contact being achieved by doping the substrate in the region of the buried contact.

5. Method as described in claim 2, further comprising:
the wafer being provided as p type material and the wells being formed as n type material.

6. Method as described in claim 1, further comprising:
a) subsequent to applying an impurity of the first conductivity type to the etched polysilicon in the well region, forming an insulating film over the substrate;
b) removing a portion of said insulating film from said substrate surface to expose a portion of the substrate; and
c) forming a conductive layer over the substrate.

7. Method as described in claim 1, further comprising:
forming a buried contact at the location that the surface of the substrate is exposed, said forming a buried contact being achieved by doping the substrate in the region of the buried contact.

8. Method as described in claim 1, further comprising:
the step of forming a capacitor dielectric layer including oxidizing the substrate.

9. Method as described in claim 1, further comprising:
the deposition of said second layer of polysilicon occurring after said anisotropic etch step.

10. Method as described in claim 9, further comprising:
applying a contact pattern consisting of contacts to the wafer subsequent to the isotropically etching of said second layer of polysilicon.

11. Method of fabricating transistor circuits having complimentary p channel and n channel transistors, in which a substrate has a first conductivity type and wells are doped to a second conductivity type, the wells being a material of opposite conductivity type as the substrate, achieved by doping to provide an opposite difference from four valence electrons as the substrate, characterized by:
a) preparing a silicon substrate which will be of a first conductivity type;
b) applying a protective layer on the substrate;
c) using a first photomask to define a region on the substrate to be implanted with an impurity in order to create a well region of semiconductor material of a second conductivity type;
d) forming a second protective layer over the well region;
e) applying an impurity to the substrate in order to establish the substrate as being of the first conductivity type in a region of the substrate which is outside of the well region, the second protective layer preventing said impurity from being applied to well region;
f) forming an insulation film on a surface of the substrate, said step of forming the insulating film including the formation of gate dielectric in the active regions;
g) using a second photomask to define active areas for devices of both channel types;
h) growing field oxide;
i) removing said photomask which was used to define active areas;
j) forming a polysilicon film, as a first polysilicon layer, over said insulating film;
k) implanting transistor sources and drains subsequent to said removal of the photomask which was used to define active areas;
l) substantially etching said first polysilicon layer in the region of the substrate which is outside of the well region, to define a pattern of transistor gates and lines to access devices from polysilicon in said region;
m) forming a capacitor dielectric layer over the substrate;
n) depositing a second layer of polysilicon over the capacitor dielectric layer subsequent to said etching of said first polysilicon layer;
o) etching said second layer of polysilicon in the region of the substrate which is outside of the well region subsequent to said deposition of the second layer of polysilicon, thereby forming capacitor plates over the capacitor dielectric layer in said region, so that each of said capacitor plates extend over at least one of said transistor sources and drains;
p) applying a photomask over the region of the substrate which is outside of the well region, said photomask also defining devices in the well region;
q) etching the polysilicon in the well region through said photomask after the etching of the second layer of polysilicon outside of the well region and after the implanting step to form sources and drains outside of the well region; and
r) applying an impurity of the first conductivity type to the etched polysilicon in the well region;

12. Method as described in claim 11, further comprising:
a) subsequent to applying an impurity of the first conductivity type to the etched polysilicon in the well region, forming an insulating film over the substrate;
b) removing a portion of said insulating film from said substrate surface to expose a portion of the substrate; and
c) forming a conductive layer over the substrate.

13. Method as described in claim 11, further comprising:
forming a buried contact at the location that the surface of the substrate is exposed, said forming a buried contact being achieved by doping the substrate in the region of the buried contact.

14. Method as described in claim 11, further comprising:
the wafer being provided as p type material and the wells being formed as n type material.

15. Method as described in claim 11, further comprising:
the step of forming a capacitor dielectric layer including oxidizing the substrate.

16. Method as described in claim 11, further comprising:
the deposition of said second layer of polysilicon occurring after said anisotropic etch step.

17. Method as described in claim 16, further comprising:

applying a contact pattern consisting of contacts to the wafer subsequent to the isotropically etching of said second layer of polysilicon.

18. An improved process sequence for the fabrication of CMOS integrated circuits on a semiconductor substrate of a first conductivity type, which comprises, in sequence, the following photomasking steps:
   a) a first photomasking step which is used to define a region on the substrate to be implanted with an impurity in order to create a wall region of semiconductor material of a second conductivity type;
   a second photomasking step which is used to define active areas for devices of both channel types;
   c) a third photomasking step which is used to pattern gates of transistors in regions of the first conductivity type during a first etch of a conductive layer;
   d) a fourth photomasking step which is used to pattern cell plates of capacitors in regions of the first conductivity type;
   e) a fifth photomasking step which, in said well region, is used to pattern gates of transistors in regions of the second conductivity type during a second etch of said conductive layer and, in said substrate region, is used to blanket the already formed gates of said transistors in the regions of the first conductivity type;
   f) establishing a layer of dielectric over the substrate following the fifth photomasking step;
   g) a sixth photomasking step which is used to define contact vias to polysilicon and active area through said dielectric; and
   h) a seventh photomasking step to define interconnects.

19. Process as described in claim 18, further comprising:
   an eighth photomasking step to define external connection areas to the integrated circuit.

20. Process as described in claim 18, further comprising:
   the seventh photomasking step defining metal interconnects.

* * * * *